United States Patent [19]

Weber et al.

[11] Patent Number: 5,075,641

[45] Date of Patent: Dec. 24, 1991

[54] HIGH FREQUENCY OSCILLATOR COMPRISING COINTEGRATED THIN FILM RESONATOR AND ACTIVE DEVICE

[75] Inventors: Robert J. Weber, Boone; Stanley G. Burns; Steve D. Braymen, both of Ames, all of Iowa

[73] Assignee: Iowa State University Research Foundation, Inc., Ames, Iowa

[21] Appl. No.: 622,251

[22] Filed: Dec. 4, 1990

[51] Int. Cl.⁵ .............................................. H03B 5/36
[52] U.S. Cl. ............................. 331/108 C; 331/116 R; 331/158; 310/314; 310/324; 357/51
[58] Field of Search ........... 331/108 C, 108 D, 116 R, 331/116 FE, 158, 107 A; 310/314, 319, 324, 325; 357/4, 40, 51

[56] References Cited

U.S. PATENT DOCUMENTS 4,456,850  6/1984  Inoue et al. ......................... 310/324
4,816,778  3/1989  Weber .................................... 331/57
4,988,957  1/1991  Thompson et al. ............. 331/107 A

OTHER PUBLICATIONS

Burns et al., "Design, Analysis, and Performance of UHF Oscillators Using Thin-Film Resonator-Based Devices as the Feedback Element", IEEE Midwest Symposium on Circuits and Systems, Aug. 1989.
Burkland et al., "A Thin-Film Bulk Acoustic-Wave Resonator-Controlled Oscillator on Silicon", IEEE Electron Device Letters, vol. EDL-8, No. 11, Nov. 1987.
Burns et al., "UHF Oscillator Performance Using Thin-Film Resonator Based Topologies", 41st Annual Frequency Control Symposium, 1987, pp. 382-387, (Mar. 1987).
Burns et al., "Design and Performance of Oscillators Using Semiconductor Delay Lines", 1987 Ultrasonics Symposium, pp. 369-373, (Jul. 1987).
Katyl, "Monolithic Crystal Oscillator", IBM Technical Disclosure Bulletin, vol. 20, No. 3, Aug. 1977.

Primary Examiner—Siegfried H. Grimm
Attorney, Agent, or Firm—Leydig, Voit & Mayer

[57] ABSTRACT

A cointegrated high frequency oscillator including a thin film resonator and active devices formed on the same semiconductor substrate and by a process which is compatible with formation of both the thin film resonator and the active devices. The processes utilized in formation of the thin film resonator are adapted to microelectronic processing techniques such that the steps of formation of the active devices and the thin film resonator can be intermixed to the degree necessary to allow, for example, the metallization layers to serve as elements both of the active devices and the thin film resonator.

21 Claims, 4 Drawing Sheets

FIG. 4

HIGH FREQUENCY OSCILLATOR COMPRISING COINTEGRATED THIN FILM RESONATOR AND ACTIVE DEVICE

FIELD OF THE INVENTION

This invention relates to electronic oscillators, and more particularly to oscillators capable of operating at very high frequencies and incorporating active devices interconnected with one or more thin film resonators.

BACKGROUND OF THE INVENTION

It has been proposed to utilize thin film resonators, such as stacked crystal filters, as the frequency selective element along with active devices in high frequency oscillator circuits. For example, in commonly assigned Thompson et.al. U.S. application Ser. No. 358,624, now U.S. Pat. No. 4,988,957, there is disclosed a thin film resonator in the form of a stacked crystal filter connected as the feedback element in an amplifier circuit for oscillation at high frequencies. The exemplary embodiment disclosed in the patent application was a microstrip implementation, although the desirability of cointegration was noted.

One of the difficulties involved in cointegrating the thin film resonator and active devices in a monolithic high frequency oscillator is the fact that the processes for producing the active devices and thin film resonator are not in all respects compatible. In order to achieve a high quality high frequency oscillator, the characteristics of both the active devices and the thin film resonator must be optimized, and the processing techniques for forming those respective devices, to the extent they are incompatible, prevent the optimization of the characteristics of both. Certain incompatibilities also have a significant negative impact on yield.

Taken separately, the technology for fabricating high frequency (greater than 2 GHz) junction or trench-isolated buried junction transistors (BJT's) is well known. Various techniques have also been developed and published for forming thin film resonators, although those techniques have certain shortcomings.

The basic thin film resonator technology uses DC magnetron sputtered highly-oriented thin films of dielectric material, preferably aluminum nitride (AlN) or zinc oxide (ZnO). The dielectric film is deposited between a pair of conductive electrodes, typically thin film aluminum electrodes, and the electrodes serve not only as electrical interconnections, but also acoustic reflecting surfaces for guiding and trapping the acoustic energy in the dielectric thin film. The acoustic cavity for the resonator is defined by the piezoelectric-silicon composite membrane structure. That membrane should be of low mass for high frequency operation, and that, in turn usually requires the removal of substrate material underlying the membrane portion of the thin film resonator. It has been typical to accomplish that by first forming a highly doped p+ region near the top surface of the semiconductor substrate, then etching an aperture from the bottom surface terminating at the p+ layer, which functions as an etchant stop. The thin film resonator is then formed on the p+ membrane. After formation of the thin film resonator, a selective etching process removes the p+ membrane, leaving the resonator suspended.

The etching processes for producing that device are such that it has not been practical to form the semiconductor portions of the active device prior to the final etching of the thin film resonator. Thus, the wafer must be substantially fabricated with respect to the thin film resonator before the process for formation of the cointegrated semiconductor devices can begin. However, the process of producing the p+ membrane and the subsequent etching steps, as well as the steps involved in formation of the thin film resonator, have a tendency to propagate defects into the semiconductor substrate which in turn limit the ability to form reliable semiconductor devices in that substrate. For these as well as a variety of other reasons, such as the incompatibility of the p+ implant with the n-type diffusions needed for the high frequency transistors, cointegration has not been entirely feasible. Indeed, the hybrid nature of the devices is believed to have been conventional rather than the exception because of the incompatibility of the processes forming the two types of devices.

SUMMARY OF THE INVENTION

In view of the foregoing, it is a general aim of the present invention to provide a process for producing a cointegrated high frequency oscillator using a thin film resonator and one or more high frequency semiconductor active devices, and in which both types of devices are formed in proximity on the same semiconductor substrate in a process which is substantially integrated.

In that respect, it is an object of the present invention to provide a cointegrated high frequency oscillator in which the thin film resonator portion of the cointegrated device is formed by a process which allows for substantial completion of the active device before metallization for the thin film resonator need be deposited.

It is a general object of the present invention to produce an integrated oscillator which is comparatively simple to fabricate, and thus comparatively inexpensive in mass production, by integrating the process steps which form the active semiconductive devices with the process steps for forming the thin film resonator. Further in that regard, an object is to utilize process techniques and conditions in connection with formation of the thin film resonator which allow for initial formation of the semiconductor regions in the substrate before metallization layers for the thin film resonator are deposited.

According to one particular aspect of the invention, an object is to form a highly integrated application specific integrated circuit which includes both thin film resonator devices and active devices (as well as ancillary devices such as resistors, capacitors and inductors) and to form such application specific integrated circuit using a set of process conditions which are highly compatible and integratable to allow for economical definition of a variety of integrated oscillators by definition of a metallization pattern for the reasonably inexpensive application specific integrated circuit.

It is a resulting object to achieve high frequency oscillators which have heretofore required substantial design effort in a simple and efficient manner, and on a single integrated semiconductor chip.

It is a feature of the invention that an integrated oscillator is configured without the need for a p+ membrane in formation of the thin film resonator, such that the resonator formation aspects of the process are entirely compatible with the process steps for producing the active devices.

It is a feature of the present invention, according to one aspect, that a thin film resonator and one or more active devices are integrated on the same semiconductor substrate with formation of one of the metallization layers, which is an element of both the active device and thin film resonator, being the unifying process step in integrating the devices. According to that feature, the invention provides a process for forming the thin film resonator portion of the circuit which is entirely compatible with preformation of the doped regions of the active device, so that the active device doping can take place before metallization for the thin film resonator commences.

According to a subsidiary feature of the invention, an application specific IC (ASIC) is provided which includes a number of thin film resonators, a relatively large number of transistors, and ancillary passive devices, which are capable of simple interconnection in a multitude of ways (in an application specific designed interconnection metallization layer) to provide a truly integrated oscillator in the high frequency range typically served by hybrid devices.

BRIEF DESCRIPTION OF THE DRAWINGS

Other objects and advantages will become apparent from the following detailed description when taken in conjunction with the drawings, in which.

While the invention will be described in connection with certain preferred embodiments, there is no intent to limit it to those embodiments. On the contrary, the intent is to cover all alternatives, modifications and equivalents included within the spirit and scope of the invention as defined by the appended claims.

DETAILED DESCRIPTION OF THE PREFERRED EMBODIMENTS

Figure 1:
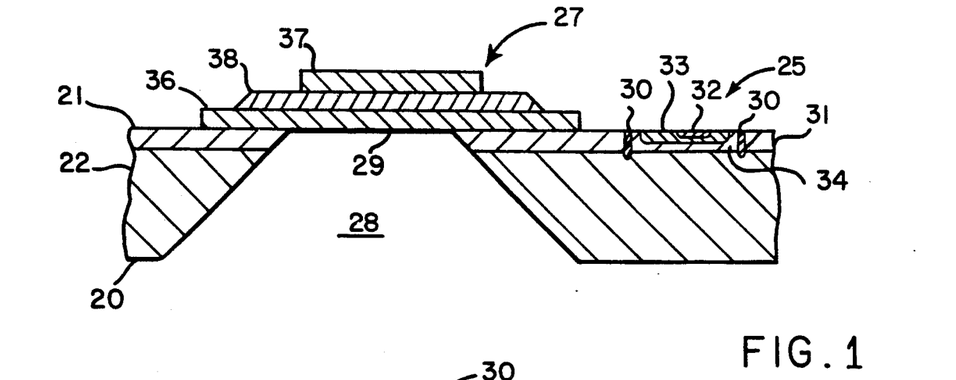
FIG. 1 is a diagram schematically illustrating a cointegrated circuit exemplifying the present invention, and including a thin film resonator and a transistor which can be connected as a cointegrated oscillator.

Turning now to the drawings, FIG. 1 is a diagram which schematically illustrates the cointegration of active devices and thin film resonators to form an integrated oscillator. The integrated device is based on a semiconductor substrate 20 which has upper 21 and lower 22 opposed surfaces, which are generally planar and parallel. A first region 24 formed on the substrate 20 is used for formation of an active device, in the illustrated embodiment a trench isolated buried junction transistor 25. That type of transistor is particularly suited to high frequency applications, and thus is the currently preferred form of active device. However, other types of active transistor type devices can also be utilized where desired. Juxtaposed to the transistor 25 is a second region 26 which serves as a region for formation of a thin film resonator 27. An aperture 28 formed below the thin film resonator 27 frees a membrane portion 29 for acoustic vibration so that the thin film resonator can operate in the fundamental mode. When overmoded operation is desired, the semiconductor substrate, or portions thereof, need not be removed.

Referring in greater detail to the transistor 25, it is seen that a pair of trenches 30 are provided for isolating the active device from the remainder of the devices formed in a doped layer 31 in the substrate. The transistor 25 includes additional patterned doped regions forming an emitter 32 located centrally of the device, an intermediate base 33, and a collector 34 formed in the lower portion of the doped layer 31. The manner of forming the transistor will be described in greater detail below. Suffice it to say for the moment that the dopant impurities which form the base, emitter and collector are deposited by conventional techniques, such as diffusion or ion implantation, into the surface of the substrate, or into layers such as epitaxially grown layers formed on the surface of the substrate. When it is described herein that the dopant regions are associated with the first surface of the substrate, what is intended is a broad description of formation of the active semiconductor device on that surface, whether or not it includes epitaxial grown layers, and whatever means are used for formation of the patterned doped regions which make up the n-type or p-type doped regions of the semiconductor device.

Turning to the thin film resonator, it is seen that FIG. 1 illustrates a two terminal device including a lower metal electrode 36, and an upper metal electrode 37 sandwiching an intermediate thin film piezoelectric layer 38. The metal electrodes 36, 37 as will be described in greater detail below, are typically thin film electrodes deposited as by sputtering or electron beam evaporation. It is important that the metallic layer forming metal electrode 36 be smooth, thin and continuous and provide a smooth surface for receiving a highly oriented thin film of piezoelectric material. The piezoelectric thin film layer 38 is deposited as by DC magnetron sputtering, following which the upper electrode 37 is deposited. In practicing certain aspects of the invention, it is efficient to utilize the lower metal electrode 36 as one of the interconnections to the active device represented by transistor 25, and thus the metallization layer 36 will typically extend to and connect with one of the electrodes in the active device. However, in certain other embodiments of the invention, such as those which provide an application specific IC providing for flexibility of interconnection of individual elements, the resonator and active devices may not be interconnected at the formation stage.

The ability to form a thin film resonator 27 and an active device such as transistor 25 in close juxtaposition as illustrated in FIG. 1 is provided in substantial measure by the integrated process according to the present invention. In practicing the invention, and as will be described in greater detail in connection with FIG. 3, the dopant layers for forming the active device 25 are first deposited into the top surface of the semiconductor substrate. Following that, the first metallization for the thin film resonator is deposited, followed by the subsequent steps for forming piezoelectric layers and additional electrodes for the thin film resonator. The thin film resonator is formed on the substrate at a time when the substrate is strong and capable of withstanding the various processes for formation of the foregoing elements. Having formed the thin film resonator, the active device, metallization for the contacts, and interconnections if desired, the partly formed device is then subjected to an etching step which removes all or at least a portion of the substrate material from below the membrane portion of the thin film resonator. In accordance with the invention, the etching step is adapted to selectively etch the pure silicon of the substrate, while being relatively nonreactive to the materials formed on the upper surface of the device, such as the metallization and the dielectric which are exposed on that upper surface. Thus, the process steps provide for a relatively non-fragile wafer during the numerous steps needed to deposit the dopant impurities, perform the lithographic steps, etching steps, sputtering steps and the like, then, late in the process, after the majority of the process steps are completed, etches away the necessary material to free the resonator, but accomplishes the etching step in such a way that the delicate and previously formed resonator and active elements are not damaged. The ability to accomplish that is particularly significant when one compares the mass of silicon which must be removed from below the resonator with the comparatively smaller mass and size of the portions of the devide which must be protected.

Figure 2:
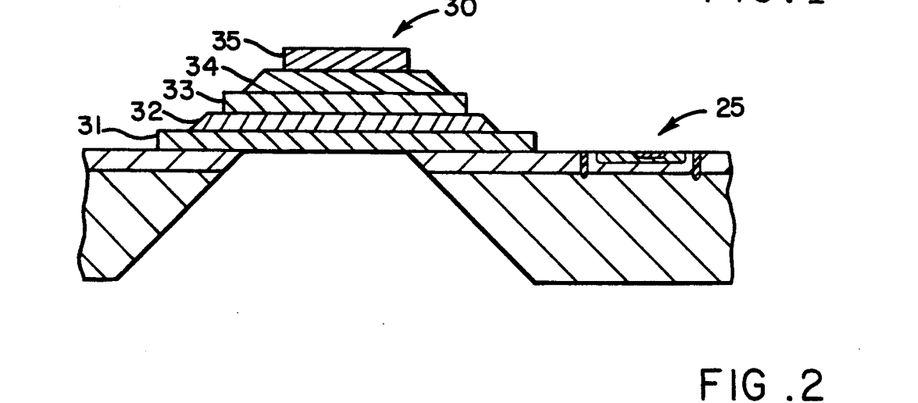
FIG. 2 is a diagram similar to FIG. 1 but illustrating a stacked crystal filter as the thin film resonator element.

Turning to FIG. 2, there is shown an alternative form of the integrated device of FIG. 1, which incorporates a stacked crystal filter 30 as the thin film resonator. As is well known, the stacked crystal filter includes a lower electrode 31 and a first piezoelectric thin film 32, an intermediate electrode 33, a second piezoelectric thin film 34, and an upper electrode 35. In oscillator applications, it is often desirable to bring all of the electrodes 31, 33 and 35 out to conductive pads (such as for application in an ASIC) so that one of the ports, i.e., the resonator existing between electrodes 31 nd 33 serves as the input port, while the second and coupled port, the resonator existing between electrodes 33 and 35, functions as the output port.

In a dedicated intergrated circiut, the electrodes 31, 33 and 35 will be connected to particular terminals in the active device represented by transistor 25. It will also be appreciated that in a dedicated integrated circiut, the active device represented by transistor 25 is indeed only represented by that transistor, and that usually a more complex amplifier including multiple transistors and other devices will be used. Often the thin film resonator, represented by the stacked crystal filter, will be connected in the feedback path of the amplifier to form an oscillator. For the details of circiut interconnections for such an amplifier, reference can be made to the aforementioned Thompson et.al. application.

Turning now to FIGS. 3a—3g, there are illustrated a sequence of process steps and the state of formation of the device as it progresses from step to step beginning with a raw semiconductor substrate through the manufacture of a cointegrated oscillator. It will be appreciated that the process steps relate to formation of a single thin film resonator, in the present instance a two electrode device, which is representative of a broader range of thin film resonators, and a single transistor, which also is representative of a more complex active circuit. Thus, while the masking will be more complex for formation of devices of the necessary complexity, the sequence of process steps will remain substantially the same.

In addition, the process steps for forming the active device are those used in connection with formation of a trench isolated buried junction transistor which, as noted above, is the currently preferred form of high frequency device. However, the invention should not be construed as limited to use of that type of device, and the illustration of the detailed steps for formation of a trench isolated buried junction transistor are simply intended to illustrate the compatibility between the conventional integrated circuit process steps and the steps for formation of the thin film resonator.

Figure 3A:
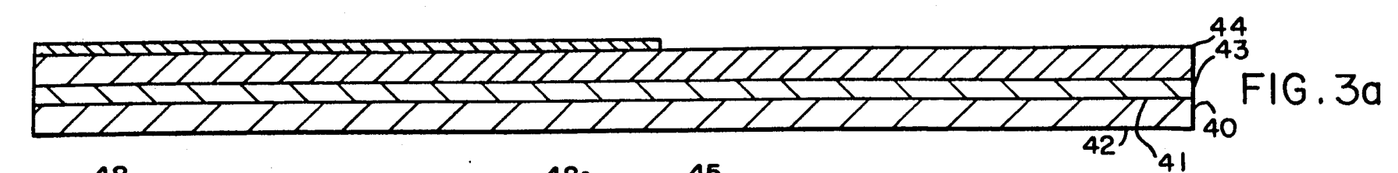
FIGS. 3a-3g sequentially illustrate the process steps for forming a cointegrated oscillator exemplifying the present invention.

With that in mind, turning to FIG. 3a, there is shown a semiconductor substrate 40 having an upper planar surface 41 and a lower planar surface 42 which are substantially parallel. The substrate 40 in the present illustration is preferably a p-type silicon wafer, approximately 100 micrometers n thickness, with both sides polished. An n+spreader layer 43 and an n—type drift layer 44 are epitaxially grown on the top surface 41 of the substrate. When used in connection with a buried unction transistor, the n+layer 43 will function as a collector, and the base and emitter will be formed in the n—layer 44.

Figure 3B:
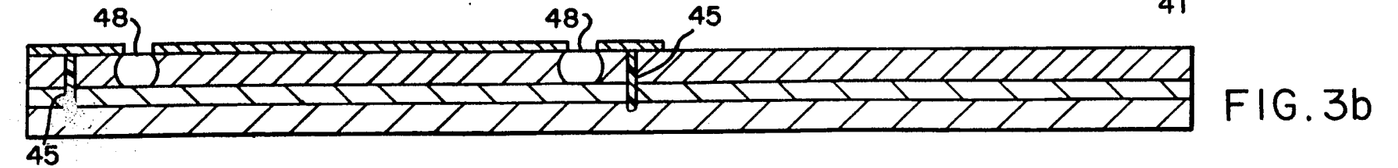

Having thus formed the doped layers 43, 44 on the upper surface 41 of the substrate 40, the upper surface (over the epitaxially grown layers) is masked or patterned as by photolithography, to define trenches 45 which isolate all of the transistors, resistors and capacitors, as shown in FIG. 3b. Trenching is then performed using conventional reactive ion etching (RIE) techniques.

After formation of the trenches, the trenches are then filled to provide surface planarity. Trench refill is accomplished using thermally grown silicon dioxide, or utilizing polysilicon and thermal silicon dioxide trench fill. The polysilicon refill process is preferred because it minimizes the overall degree of thermal processing required. Polysilicon is deposited by means of chemical vapor deposition in an epitaxial reactor. Having restored surface planarity, a mask is formed over the upper surface and patterned by photolithography to define sinker apertures 48 (see FIG. 3b). The sinkers 48 are filled, for example by conventional liquid phase epitaxy, with n+material intended to provide a low resistivity connection to the layer 43 which serves as the transistor collector.

Figures 3C, 3D:
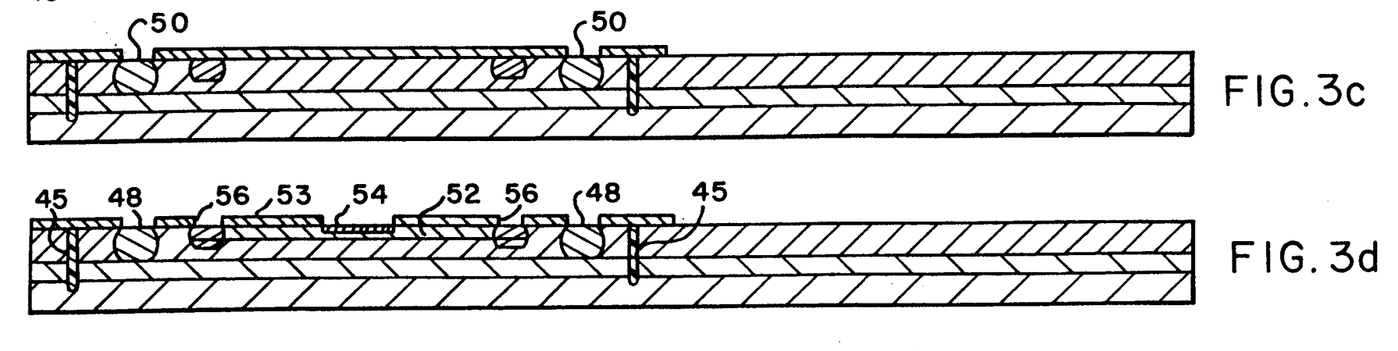

FIG. 3c then illustrates the subsequent step of forming guard rings 50 in the base region of the transistor. The guard ring, as is well known, enhances high frequency operation in this type of device. The rings 50 are formed by diffusing of p-type material into the substrate through an appropriately defined mask. A low resistivity base region 52 is also provided by diffusing p-type material of higher concentration than in the guard rings into the base region 52, as illustrated in FIG. 3d. The masks for guard ring diffusion as shown in FIG. 3c, and main base diffusion as shown in FIG. 3d can be similar, with a common portion defining the exterior outside of the ring, an intermediate central portion being present for definition of the guard rings, then removed during the main base diffusion.

Having formed the base and the guard ring structure illustrated in FIGS. 3c and 3d, an emitter diffusion is then performed as further illustrated in FIG. 3d. An appropriate mask formed in an insulator layer 53 is utilized to expose a central portion of the base region 52, and n-type dopant impurities diffused into the unmasked central portion to form an n-type emitter region 54 centrally of the previously formed p-type base region. The emitter diffusion is preferably fairly shallow to provide an active base region thickness below the emitter region of about 0.25 microns or less.

As is also shown in FIG. 3d, the insulator layer 53 which had been patterned to form the emitter 54 is further patterned and etched to form base vias 56 allowing electrical contact with the base region 52. Thus, as the partly completed device exists in FIG. 3d, all of the patterned regions for the semiconductor are doped with the appropriate conductivity impurities and the device is prepared to receive metallization for connection to the various electrodes of the active device, in the illustrated embodiment to the base, emitter and collector of the transistor. Thus, the emitter 54 is exposed through the aperture in insulator 53 which allowed the emitter diffusion. The base is exposed through vias 56 formed in the insulator layer 53. And the collector is exposed via sinker contacts 48.

Figure 3E:
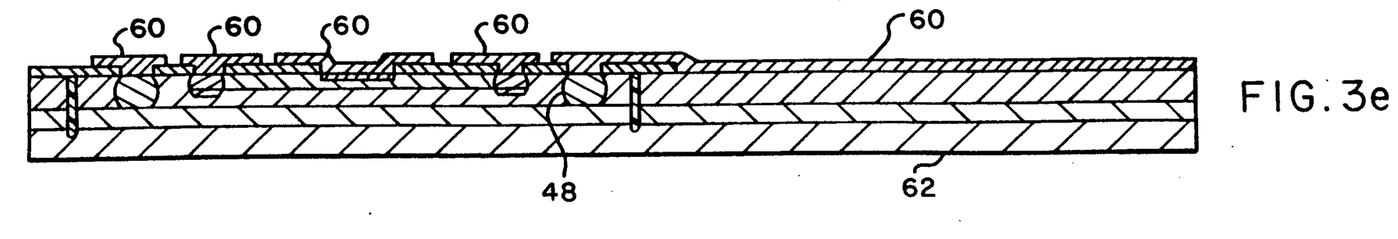

In accordance with the invention, complementary process steps are then utilized to form the thin film resonator in juxtaposition with the partly formed active semiconductor device. Thus, in the exemplary process of FIG. 3, FIG. 3e illustrates the deposition of a first conductive layer 60 which, in that illustrated embodiment, serves not only as the lower electrode for the thin film resonator, but also as interconnecting metallization with the active device. Thus, it is seen that the layer 60 is deposited in a region 62 in which the thin film resonator will be formed, and also extends to form electrical contact with the sinker 48 and thus is in electrical contact with the collector of the active device. It is noted that the connection to the collector is only exemplary, with FIG. 3 being intended to illustrate the ability to interconnect the devices, rather than the specific terminals which need to be interconnected in a particular configuration. It will be apparent that by appropriate air bridge techniques, for example, the metallization 60 can be connected to any of the base or emitter contacts of the transistor if desired.

In utilizing the metal layer 60 as both an electrode of the thin film resonator as well as a conductor connected to the semiconductor device, it is desirable to utilize silicon doped aluminum (1%-2%) to enhance the function of the conductor as a contact metal. The metal layer is preferably deposited by RF sputtering or electron beam evaporation. RF sputtering is desirable because it achieves better contact with the active region of the semiconductor device.

Having deposited the metallization 60, the metal is then covered with a photoresist, patterned and etched to form the metal layer into the desired pattern. The desired pattern will include a comparatively large area (e.g., 400 by 400 micron rectangular area) as the resonator section of the thin film resonator, as well as thin interconnecting conductors to the active device. When formed as an ASIC, the metallization can also include conventional contact pads.

Figure 3F:
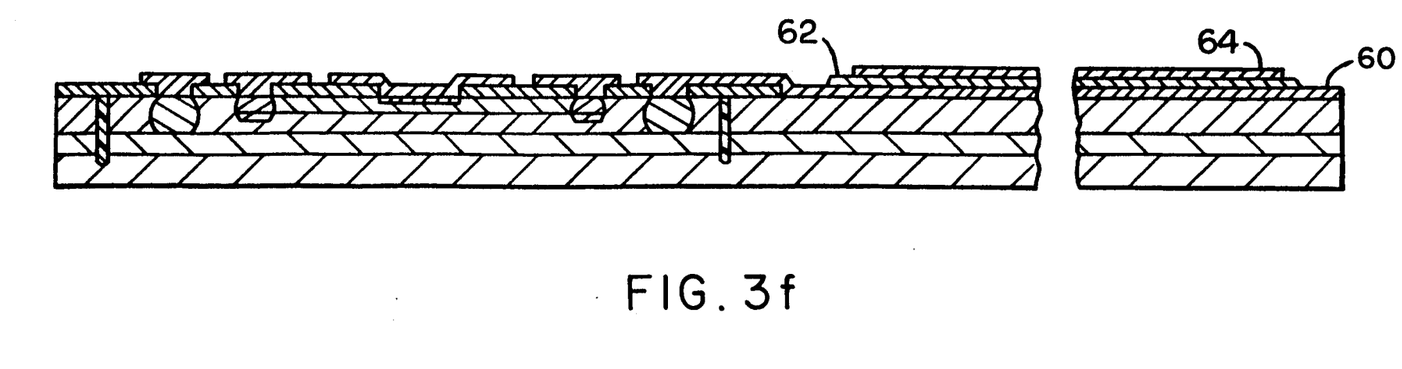

After the photoresist is stripped from the device in the condition illustrated in FIG. 3e, the process proceeds to the stage illustrated in FIG. 3f which includes the formation of the thin film piezoelectric layer 62. The piezoelectric layer 62 is preferably of AlN deposited in an oriented film by DC sputtering. An available technique for patterning the AlN layer over the lower metallization 60 is by sputtering through a fixed mask. However, in practicing the present invention, it is presently preferred to use a dielectric liftoff process for patterning of the AlN piezoelectric layer.

In utilizing the dielectric liftoff process, an initial layer, which will serve as a sacrificial layer in the dielectric liftoff process, is first deposited. It is currently preferred to utilize zinc oxide as the sacrificial layer and to deposit that material by sputter deposition using a DC magnetron. A zinc target is utilized in an oxygen plasma to deposit a ZnO layer, preferably about 5 microns in thickness, over the entire upper surface of the device. The zinc target is then removed and a silicon target put in its place to deposit about 1000 Å of silicon dioxide over the ZnO layer. A layer of photoresist is then spread over the silicon dioxide and photolithographically patterned to create windows in which the aluminum nitride is to be formed. The silicon dioxide is then etched, using a buffered hydrogen fluoride solution. Following etching of the window in the silicon dioxide, the zinc oxide is then etched using hydrochloric acid. The double etching leaves a shelf of silicon dioxide over a cavity in the ZnO which exposes the aluminum below the zinc oxide layer.

Having thus opened windows over the aluminum in the areas in which the piezoelectric resonator material is to be deposited, the device is returned to the DC magnetron. Using a highly pure aluminum target (99.999% purity) in a nitrogen atmosphere, a very pure thin and smooth layer of aluminum nitride is deposited, approximately 5 microns in thickness.

After deposition of the aluminum nitride film, the wafer is then soaked in dilute hydrochloric acid which tends to dissolve the ZnO. That process is conventionally known as dielectric liftoff. In the present instance, the aluminum nitride in regions other than the window is removed, leaving an aluminum nitride thin film deposited over and in intimate contact with the aluminum in the region which had been defined by the window. The partially completed device at this stage is illustrated in FIG. 3f.

The device is then returned to a further photolithographic process for formation of an upper electrode 64. FIG. 3f also shows the upper electrode as deposited over the aluminum nitride piezoelectric layer 62, but not showing any extensions of the metallization for interconnection to the active devices. However, it will be apparent that the upper electrode will be brought out to contacts (not shown) or interconnections to the active device, as will be determined by the particular circuit configuration of the oscillator being constructed. The showing of FIG. 3f is simply intended to illustrate the process step for forming the upper electrode 64 and piezoelectric layer 62, rather than the details of its shape.

The formation of the upper metallization is preferably by a liftoff process. Having thus patterned and deposited the dielectric layer, the upper metallization is deposited by a suitable process such as electron beam evaporation. The wafer with deposited upper metallization is then soaked in a bath of acetone to dissolve the photoresist and lift off the metal in all but the desired areas.

FIG. 3f illustrates the wafer at this stage and includes the active device represented by the transistor, the resonator device represented by the thin film resonator, and certain of the interconnections.

Figure 3G:
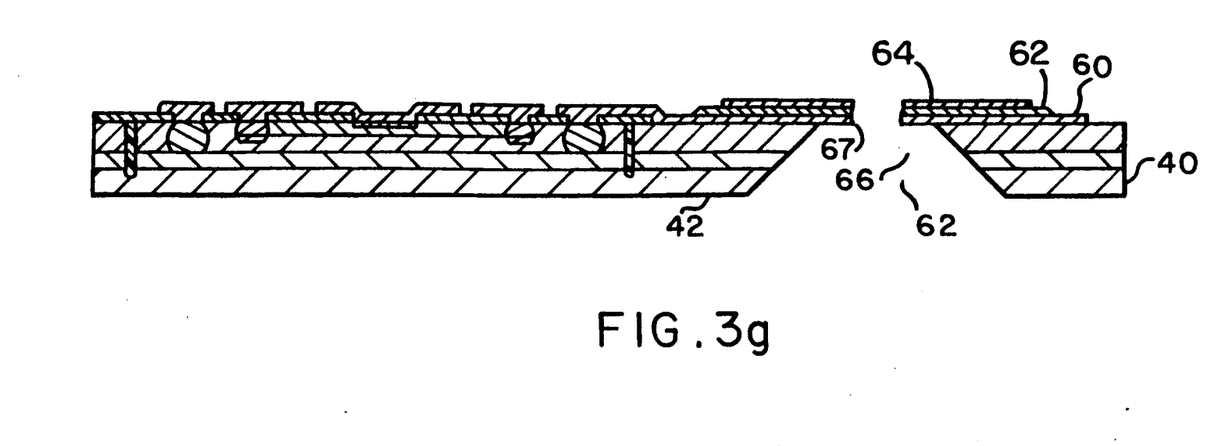

In accordance with the invention, when the thin film resonator requires a membrane in the area 62, that membrane is then formed by subsequent process steps which selectively remove the silicon substrate, but do not attack the active device, the thin film resonator, or the interconnecting metallization. FIG. 3g illustrates the patterning of an aperture 66 on the second surface 42 of the substrate 40 and the etching of that aperture in the area 62. It is seen that the etching proceeds until the lower aluminum layer 60 is reached, with the aluminum layer 60 serving as an etchant stop to define a thin membrane 67 comprising the metallization layers and intermediate aluminum nitride film forming the resonating device of the thin film resonator. Further details of the etching process will be provided below (as well as additional detail on the sputtering of the piezoelectric film) to better illustrate the practice of the present invention. However, at this point, it will be noted that the elements which are necessary for an integrated oscillator have been formed in an integrated process on the same semiconductor substrate and in close juxtaposition. There is little requirement in the process steps which form the respective devices to require great separation between the devices, allowing use of two micron design rules for the integrated device. The diffusion profiles required for high frequency transistors are considerably easier to obtain in the illustrated process because of the lack of a p+ membrane needed for formation of the thin film resonator according to prior techniques. As will be appreciated from an examination of FIGS. 3a—3f, in that process flow virtually all device processing is completed except for the top side circuit defining metallization before the thin film resonator formation steps are initiated.

Figure 4:
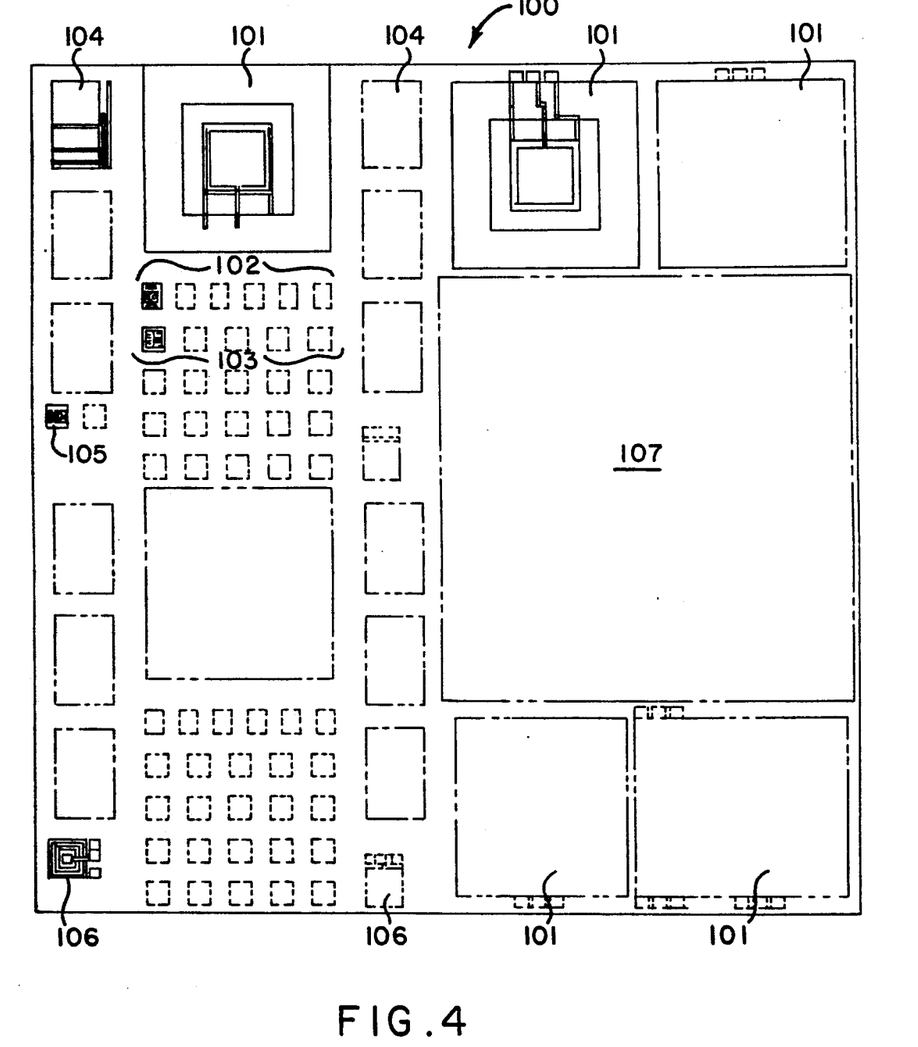
FIG. 4 is a diagram illustrating an application specific IC (ASIC) which can be configured as an embodiment of the present invention.

FIG. 4 is a diagram illustrating an application-specific integrated circuit (ASIC) palette or chip 100 which is formed from the process according to the present invention for cointegrating active devices with thin film resonators.

ASIC chip 100 includes several thin film resonators 101, trench isolated npn transistors 102, and resistors 103. ASIC chip 100 also includes digitally-scaled MOS capacitors 104 having fusible links for tuning if necessary, pnp transistors 105, and inductors 106. The remaining components on ASIC chip 100 comprise a series of test patterns used to perform various tests on the components of ASIC chip 100. These test patterns are not shown in detail, but area 107 of the ASIC is indicated as being reserved for such as test patterns.

ASIC chip 100 shown in FIG. 4 includes a relatively large number of components so that a single ASIC chip can be used to design a wide variety of cointegrated oscillators, band pass amplifiers, or other devices operable at high frequencies. ASIC chip 100 is highly versatile, and provides all of the components necessary to design and fabricate numerous high frequency devices, and therefore eliminates the need for additional microelectronic chips in order to complete a particular design. Thus, ASIC chip 100 can be used to design oscillators and amplifiers requiring varying degrees of characteristics such as tunability, stability, and power output. A particular cointegrated oscillator or other device can be easily realized with ASIC chip 100 by masking a top metallization layer across the ASIC chip to interconnect the various components need for a particular design.

Figure 5:
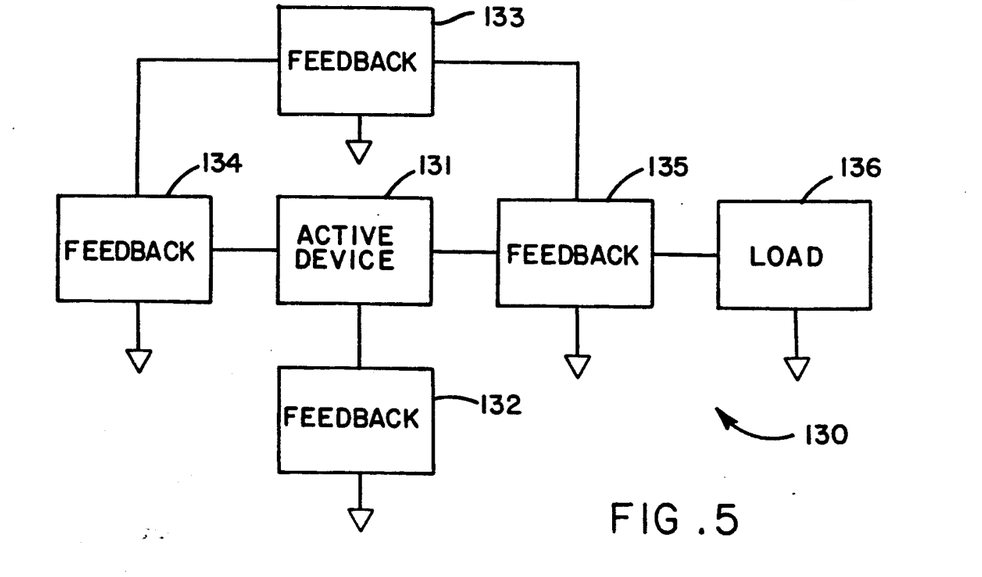
FIG. 5 is a block diagram illustrating the interconnections between a thin film resonator and an active device in the formation of a cointegrated high frequency oscillator.

FIG. 5 is a block diagram showing a basic oscillator configuration 130. FIG. 5 is included to illustrate the versatility of ASIC chip 100, and to demonstrate that it can be used to encompass a wide variety of designs for high frequency oscillators, amplifiers or other devices. For example, oscillator configuration 130 includes an active device 131 and a feedback block 132, which includes at least one of the thin film resonators 101, connected in a manner to demonstrate that series resonance can be realized with ASIC chip 100. Further, feedback block 133 is connected in a manner to demonstrate that parallel resonance can also be realized with ASIC chip 100. Oscillator configuration 130 also includes feedback blocks 134 and 135, and load block 136 to further illustrate the versatility available from ASIC chip 100.

FIG. 5 also illustrates that ASIC chip 100 includes all of the components necessary to complete a particular cointegrated high frequency oscillator. Because of the close integration and juxtaposition of the various active devices, thin film resonators, and ancillary devices such as resistors, capacitors and inductors, a metallization layer can be deposited on ASIC chip 100 which interconnects the components needed for a particular design. For example, in FIG. 5, active device 131 represents any of the number of transistors of ASIC chip 100. Further, feedback block 133 shown connected in parallel to active device 131 can be provided by one of the thin film resonators of ASIC chip 100 interconnected with any required ancillary devices necessary to complete the particular design of the cointegrated oscillator.

The significance of providing an ASIC in technology previously implemented by hybrid circuits should now be appreciated. In the past, the thin film resonator had typically been formed in a separate process requiring the high frequency oscillator to be formed as a hybrid device. In accordance with the invention, the process steps for forming the active device and the thin film resonator are rendered sufficiently compatible to not only allow formation of a specialized integrated circuit including an amplifier and the thin film resonator, but extending so far as to provide an ASIC including multiple such devices. Thus, the device of FIG. 4 shows a plurality of thin film resonators integrated with a large plurality of transistors and other ancillary devices, significantly advancing the technology well beyond prior capabilities of hybrid circuits to marry the two types of devices. Thus, where a hybrid circuit might previously have been required to provide the necessary high frequency crystal controlled stability, now it is possible using the ASIC of FIG. 4 to not only provide those design requirements in a single cointegrated circuit, but to provide the ability to design a wide variety of electrical characteristics into that circuit which is then integrated by simply designing an interconnecting mask layer.

In the process description of FIGS. 3a-3g, particular mention was made of the selective etching step for removing substrate material from below the membrane of the thin film resonator, and also the process step for dielectric liftoff in connection with patterning the dielectric layer of the thin film resonator. Additional information will now be given on those two process steps.

In removing substrate material from below the membrane of the thin film resonator, an anisotropic etching process is employed which etches along the (111) crystal axes from the rear surface 42, with the first metal layer 60 serving as an etchant stop. The rear surface 42 of the substrate is masked by suitable materials such as a silicon dioxide layer appropriately patterned using standard techniques to form windows in the areas where the membrane is to be formed. The windows can be aligned with the devices formed on the upper surface 41 as by using infrared alignment techniques.

The etching solution which has been found to be selective to silicon while substantially nonreactive to the aluminum nitride and aluminum metallization is a solution of hydrazine and quinoxaline preprocessed as will be described below. A desirable solution consists of proportions comprising approximately 850 milliliters of hydrazine hydrate (85 weight percent solution), 650 milliliters of deionized water, and approximately 1 gram of quinoxaline which had been vacuum distilled to remove oxide contamination. The solution is heated to a reaction temperature of about 108° C., its boiling point. Once the reactor is at temperature, preprocessing is commenced by immersing a silicon wafer for a short interval, approximately 5 minutes, for example. The wafer is then removed and the solution is allowed to precondition for a period, preferably at least 3 hours. The length of the interval of preconditioning is not limited to three hours, and indeed once a solution is employed to etch integrated devices on silicon, the preconditioning indeed can extend in time for substantially beyond three hours with the solution remaining selective to silicon.

Having preconditioned the etching solution by treatment with silicon and aging, wafers of the type illustrated in FIG. 3f are then immersed in the heated solution for etching. The solution is selective to silicon and thus will remove the silicon substrate in the area 66 defined by the windows while not attacking the metallization or dielectric layers on the upper surface of the device. In some cases, it may be desirable to passivate the upper surface with a material such as silicon dioxide which is not reactive to the etchant. When etching is completed, as will be determined when the etching reaches the aluminum layer 60 to which the etchant is nonreactive, thus serving as an etchant stop, the wafer is then removed from the etchant solution, rinsed with deionized water and dried, such as in a stream of nitrogen gas.

The significance of the foregoing etchant process will be appreciated in that it provides a mechanism for allowing formation of both the semiconductor device and the thin film resonator on wafers which can be readily handled in the ordinary semiconductor fabrication process flow, followed by a subsequent etching step for formation of thin film resonator membrane by a selective etching process which removes the silicon to form the membrane without attacking the elements previously put in place which make up the devices.

As noted above, the aluminum nitride film is a highly oriented and very pure film formed by sputter deposition. In forming that film, it has been found desirable to utilize specialized technique to account for the relatively long deposition times which are required. Those techniques involve utilization of a DC magnetron reactive sputtering system which in one implementation uses an 1800 watt, 600 volt DC power supply as the current source. Typical operating parameters are 5 mTorr pressure, 0.5 amp current with a voltage drop across the nitrogen plasma of about 350 volts. The semiconductor substrate is positioned opposite a very pure (99.999%) aluminum target. A ring positioned between the substrate and target acts as an anode to assist in containing and stabilizing the nitrogen plasma. The ring typically has a potential of about 40 volts. The plasma contains a large number of positively charged ions which accelerate into the target, knocking loose atoms of aluminum. The aluminum atoms then traverse the chamber and deposit on available surfaces. When being deposited in the presence of a reactive gas such as nitrogen, the aluminum atoms will form compounds, in the present instance aluminum nitride.

As noted above, the aluminum nitride film is preferably about 5 microns in thickness in order to provide resonator response at about 1 GHz. At optimum deposition parameters, approximately 4 hours of deposition are required. In addition, the crystal grain growth must be oriented in order to provide good piezoelectric response.

Using those relatively long deposition times, the chamber of the magnetron becomes electrically insulated, which can result in impurities being dislodged from the chamber and deposited in the aluminum nitride film forming on the semiconductor substrate.

In accordance with this aspect of the invention, during the relatively elongated deposition procedure, a layer of aluminum metal is periodically deposited over the aluminum nitride buildup on the chamber to prevent contamination of the AlN film being deposited on the semiconductor substrate. This is accomplished by changing the reactive gas in the chamber to argon in place of the nitrogen for a brief period. To prevent the wafer from being coated with the aluminum during this periodic "cleansing" process, a shutter is moved into place over the substrate to act as a shield. Thus, at periodic intervals, such as about 30 minutes, during the deposition of the aluminum nitride, the shutter is closed and the nitrogen atmosphere replaced with argon, to coat the walls and other elements of the reactor with an aluminum film. The argon is then removed and the nitrogen atmosphere returned, following which the shutter is opened and aluminum nitride deposition continued, until the required thickness has been built up. The alternating of AlN and Al deposition (with shutter closed during Al deposition) is repeated until the required amount of AlN has been deposited onto the semiconductor substrate. This procedure has been found to produce substantially purer films than has been available using conventional sputtering techniques.

This disclosure has provided substantial detail on a number of related processes which are utilized in the formation of active semiconductor devices and thin film resonator devices. The details of the process are important, but it is of particular significance that the processes are all cointegratable for formation of an integrated oscillator device which of necessity includes both active elements and one or more thin film resonators. The process steps unique to the formation of the thin film resonator are adapted for forming high quality resonators, freeing the membrane for vibration, and all in a manner which is entirely compatible with and not destructive of the active semiconductor devices which are formed in the integrated process.

It will thus be appreciated that what has been provided is an integrated process for formation of high frequency oscillators including both resonators and active devices, and the resulting device.

What is claimed is:

1. A cointegrated oscillator comprising, in combination:
   a semiconductor substrate having opposed first and second substantially planar surfaces,
   dopant regions associated with the first surface of the substrate and patterned to form at least one active device interconnectable to serve as an amplifier,
   a thin film resonator supported on the first surface of the substrate closely adjacent the active device, the thin film resonator having a lower conductive electrode deposited directly on the semiconductor substrate, and metallization interconnecting the active device and the thin film resonator in such a way that the thin film resonator is connected to serve as a frequency selective element for the oscillator, the interconnecting metallization also serving as one of the thin film resonator electrodes.

2. The combination as set forth in claim 1 wherein the thin film resonator includes a resonating membrane, and an aperture formed in the second surface of the substrate and penetrating to the resonating membrane so as to free said resonating membrane for oscillation.

3. The combination as set forth in claim 2 wherein the thin film resonator is a stacked crystal filter having a first port comprising the lower conductive electrode, a first piezoelectric film, and an intermediate electrode, and a second port comprising the intermediate electrode, a second piezoelectric film, and an upper electrode.

4. The combination as set forth in claim 3 wherein the stacked crystal filter is connected in a feedback path of the amplifier to serve as the frequency selective element of the cointegrated oscillator 5. The combination as set forth in claim 2 wherein the aperture is an etched aperture formed in a selective etching process to which the thin film resonator and active device are subjected.

6. A cointegrated high frequency oscillator having a thin film resonator connected to an amplifier as the frequency selective element of the oscillator, and comprising, in combination:
   a semiconductor substrate having a pair of opposed generally planar parallel surfaces,
   active devices comprising the amplifier formed on the first surface of the semiconductor substrate, the active devices having patterned regions of dopant impurities disposed to function as said active devices,
   a first metallization layer forming a conductive pattern on the first surface of the semiconductor substrate interconnected to the active devices, the conductive pattern also having an electrode portion serving as an electrode of the thin film resonator,
   a thin oriented piezoelectric film deposited on the electrode portion of the conductive pattern to serve as a piezoelectric element of the thin film resonator,
   a second metallization layer deposited over the piezoelectric film for serving as a second electrode of the thin film resonator, the second metallization layer being interconnected to the active device to cause the amplifier and the thin film resonator to function in circuit interrelationship as a high frequency oscillator, and
   the thin film resonator and active devices being juxtaposed on the semiconductor substrate so that all of the interconnections between the thin film resonator and the active devices are accomplished by integrated metallization layers.

7. The combination as set forth in claim 6 wherein the thin film resonator further includes a an aperture etched in the semiconductor substrate penetrating the second surface of the substrate and reaching to the first metallization layer below said electrode portion, the aperture in the substrate serving to free the thin film resonator for vibration.

8. The combination as set forth in claim 7 further including a second piezoelectric film deposited on the second metallization layer, and a third metallization layer deposited over the second piezoelectric film, and serving as a third electrode in a stacked crystal filter comprising said first through third metallization layers and said first and second piezoelectric films, whereby the thin film resonator is configured as a stacked crystal filter.

9. The combination as set forth in claim 7 wherein the aperture is an etched aperture formed by a selective etching process to which the active devices and thin film resonator are resistant.

10. The combination as set forth in claim 8 in which the stacked crystal filter is connected in the feedback path of the amplifier.

11. An application-specific cointegrated circuit formed on a semiconductor substrate having opposed first and second substantially planar surfaces for providing cointegrated high frequency oscillators comprising, in combination:
   a plurality of active devices formed on the first surface of the semiconductor substrate,
   a plurality of thin film resonators each having at least a lower conductive layer serving as a lower electrode, a thin oriented piezoelectric film deposited on the lower electrode to serve as a piezoelectric element, and an upper conductive layer deposited on the piezoelectric film serving as an upper electrode,
   a plurality of ancillary devices positioned closely adjacent the plurality of active devices and the plurality of thin film resonators, and
   an upper conductive layer also extending across the substrate for selectively interconnecting the closely integrated and juxtaposed plurality of active devices, thin film resonators, and ancillary devices to provide the cointegrated high frequency oscillators.

12. The combination as set forth in claim 11 wherein the active devices, the thin film resonators and the ancillary devices include contact pads, and the upper conductive layer is adapted to establish selective interconnection between the contact pads for configuring the cointegrated high frequency oscillator.

13. The combination as set forth in claim 11 wherein the thin film resonators comprise stacked crystal filters having an intermediate electrode between the lower and upper electrodes, and a pair of piezoelectric films deposited intermediate the electrodes.

14. The combination as set forth in claim 11 including apertures in the substrate below the thin film resonators for freeing the resonators for vibration.

15. A process for forming a cointegrated oscillator including active devices comprising an amplifier and a thin film resonator interconnected with the amplifier to serve as the feedback element thereof, the process comprising the steps of:
   providing a planar semiconductor substrate having opposed generally planar parallel first and second surfaces,
   forming the active devices on the first surface of the semiconductor substrate by depositing dopant impurities in patterned areas to function as respective doped regions of the active devices,
   depositing a first metallization layer on the first surface in electrical contact with at least some of the active regions of the active devices, the first metallization extending to a juxtaposed portion of the first surface of the substrate and having an area for serving as a resonating portion of a thin film resonator, depositing a thin oriented film of pure deielectric material over the resonating portion of the first metallization layer to serve as a dielectric element of the thin film resonator, depositing a second metallization layer over the dielectric film to serve as a second electrode of the think film resonator, and etching an aperture in the second surface of the semiconductor substrate to remove an area of the substrate from below the resonating portion of the thin film resonator, the step of etching employing a selective etching solution for removing the substrate material in said area while leaving the active devices and thin film resonator substantially unaffected by the etching.

16. The process as set forth in claim 15 wherein the step of forming the active devices comprises forming at least one trench isolated buried junction transistor for high frequency operation in the cointegrated oscillator.

17. The process as set forth in claim 15 further including the step of sputtering a second thin oriented film of pure dielectric material over the second metallization layer, depositing a third metallization layer over the second dielectric film, and thereby to form a stacked crystal filter.

18. The process as set forth in claim 15 wherein the step of etching comprises providing an etchant solution including a solution of hydrazine, quinoxaline and water, and conditioning said etching solution by treating said solution with silicon and aging said treated solution, thereby rendering said preconditioned etching solution selective to silicon, the semiconductor substrate comprising a silicon substrate.

19. The process as set forth in claim 15 wherein the step of depositing a thin oriented film comprises sputtering said thin oriented film and utilizing a dielectric lift-off process to pattern the sputtered film 20. The process as set forth in claim 18 wherein the step of depositing a thin oriented film comprises sputtering said thin oriented film and utilizing a dielectric lift off process to pattern the sputtered film.

21. The combination as set forth in claim 18 further including the step of utilizing the first metallization layer as an etchant stop for the selective etching step

* * * * *